United States Patent
Ito et al.

(10) Patent No.: US 7,699,604 B2
(45) Date of Patent: Apr. 20, 2010

(54) MANUFACTURING APPARATUS FOR SEMICONDUCTOR DEVICE AND MANUFACTURING METHOD FOR SEMICONDUCTOR DEVICE

(75) Inventors: Hideki Ito, Numazu (JP); Shinichi Mitani, Numazu (JP); Hironobu Hirata, Mishima (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 11/828,771

(22) Filed: Jul. 26, 2007

(65) Prior Publication Data
US 2008/0032036 A1    Feb. 7, 2008

(30) Foreign Application Priority Data
Aug. 2, 2006   (JP)   ............................. 2006-210809
Jul. 12, 2007   (JP)   ............................. 2007-183031

(51) Int. Cl.
*F27B 5/16*    (2006.01)
(52) U.S. Cl. ........................................ 432/200; 438/14
(58) Field of Classification Search ............... 438/14; 432/200
See application file for complete search history.

(56) References Cited

U.S. PATENT DOCUMENTS

| | | | | |
|---|---|---|---|---|
| 5,965,219 | A * | 10/1999 | Hayashi et al. | 427/586 |
| 6,248,672 | B1 * | 6/2001 | Takagi | 438/758 |
| 6,250,914 | B1 * | 6/2001 | Katsumata et al. | 432/5 |
| 6,454,563 | B1 * | 9/2002 | Lim et al. | 432/200 |
| 2002/0061631 | A1 * | 5/2002 | Miyabayashi et al. | 438/478 |

FOREIGN PATENT DOCUMENTS

| | | |
|---|---|---|
| JP | 4-239120 | 8/1992 |
| JP | 2000-306850 | 11/2000 |
| JP | 2002-75886 | 3/2002 |

\* cited by examiner

*Primary Examiner*—Ha Tran T Nguyen
*Assistant Examiner*—Shaun Campbell
(74) *Attorney, Agent, or Firm*—Oblon, Spivak, McClelland, Maier & Neustadt, L.L.P.

(57) ABSTRACT

A manufacturing apparatus for a semiconductor includes a reaction chamber into which a wafer is introduced, gas supply unit for supplying a gas to the reaction chamber, gas exhaust unit for exhausting the gas from the reaction chamber, a holder for holding the wafer at an outer circumferential part of the wafer, a first heater for heating the wafer from below, a reflector provided above the holder, and a drive mechanism for driving the reflector.

11 Claims, 2 Drawing Sheets

MANUFACTURING APPARATUS FOR SEMICONDUCTOR DEVICE AND MANUFACTURING METHOD FOR SEMICONDUCTOR DEVICE

CROSS-REFERENCE TO RELATED APPLICATIONS

This application is based upon and claims the benefit of priority from the prior Japanese Patent Applications No. 2006-210809 filed on Aug. 2, 2006, and No. 2007-183031 filed on Jul. 12, 2007 the entire contents of which are incorporated herein by reference.

BACKGROUND OF THE INVENTION

1. Field of the Invention

The invention relates to a manufacturing apparatus for a semiconductor device and a manufacturing method for a semiconductor device that form a film, for example, on a semiconductor wafer by supplying a reactive gas while heating the semiconductor wafer from a back side.

2. Description of the Related Art

In recent years, with a semiconductor device having an increasingly finer structure, better uniformity in film thickness of a film formation process has been required. In a CVD (Chemical Vapor Deposition) apparatus such as an epitaxial growth apparatus, a backside heating method in which there is no heating source from above is used. Since a reactive gas can be supplied in a vertical direction from above when the backside heating method is used, a uniform film can be formed. To achieve still better uniformity in film thickness by the backside heating method, the in-plane temperature of a wafer must be controlled to be uniform. Various techniques so as to heat a wafer uniformly are described in Japanese Patent Application Laid-Open No. 2000-306850 or the like.

In recent years, there is a trend of using a larger-diameter wafer to reduce costs of devices and a requirement for an increase in an effective area of a wafer is growing. Also, with devices having an increasingly finer structure, a requirement for more accurate film thickness is rising. Thus, the film must be formed uniformly up to an edge near area of a wafer, which has hitherto been cut off. However, if the in-plane temperature of a wafer is controlled by output of the heater being controlled, the temperature of a holder holding the wafer will also vary. The temperature of an outermost circumference of a wafer depends on the temperature of a holder. Therefore, it is difficult to stabilize the temperature only by controlling output of the heater.

For example, when forming a film, the temperature rises only in edges of a wafer, causing a temperature difference between the center of a wafer and its edges of ±5-6° C. Due to this temperature difference, the thickness of a formed film (epitaxial film) varies by 1% or so. In addition, temperature variations cause slippage in the wafer. Particularly due to change of the process gas from a mono-silane gas to trichlorosilane gas, which is superior in productivity, the processing temperature has risen from 1050° C. to 1100° C. With a rising temperature of processes, the problem of slippage is becoming evident.

SUMMARY OF THE INVENTION

Accordingly, it is an object of the invention to provide a manufacturing apparatus for a semiconductor device and a manufacturing method for a semiconductor device that can uniformly heat a wafer up to an outermost circumference thereof.

A manufacturing apparatus for a semiconductor device according to the invention includes a reaction chamber into which a wafer is introduced, gas supply unit configured to supply a gas to the reaction chamber, gas exhaust unit configured to exhaust the gas from the reaction chamber, a holder for holding the wafer at an outer circumferential part of the wafer, a first heater for heating the wafer from below, a reflector provided above the holder, and a drive mechanism for driving the reflector.

A manufacturing method for a semiconductor device according to the invention, the method begins by controlling the temperature of an outermost circumference of a wafer first by holding the wafer on a holder arranged inside a reaction chamber, continues by supplying a process gas onto the held wafer, rotating the wafer, heating the wafer from below, and driving a reflector arranged above the holder.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the forgoing general description and the following detailed description are exemplary and explanatory only and are not restrictive of the invention, as claimed.

BRIEF DESCRIPTION OF THE DRAWINGS

The accompanying drawings, which is incorporated in and constitute a part of this specification, illustrates an embodiment of the invention and together with the description, serve to explain the principles of the invention.

DETAILED DESCRIPTION OF THE EMBODIMENTS

Figure 1:
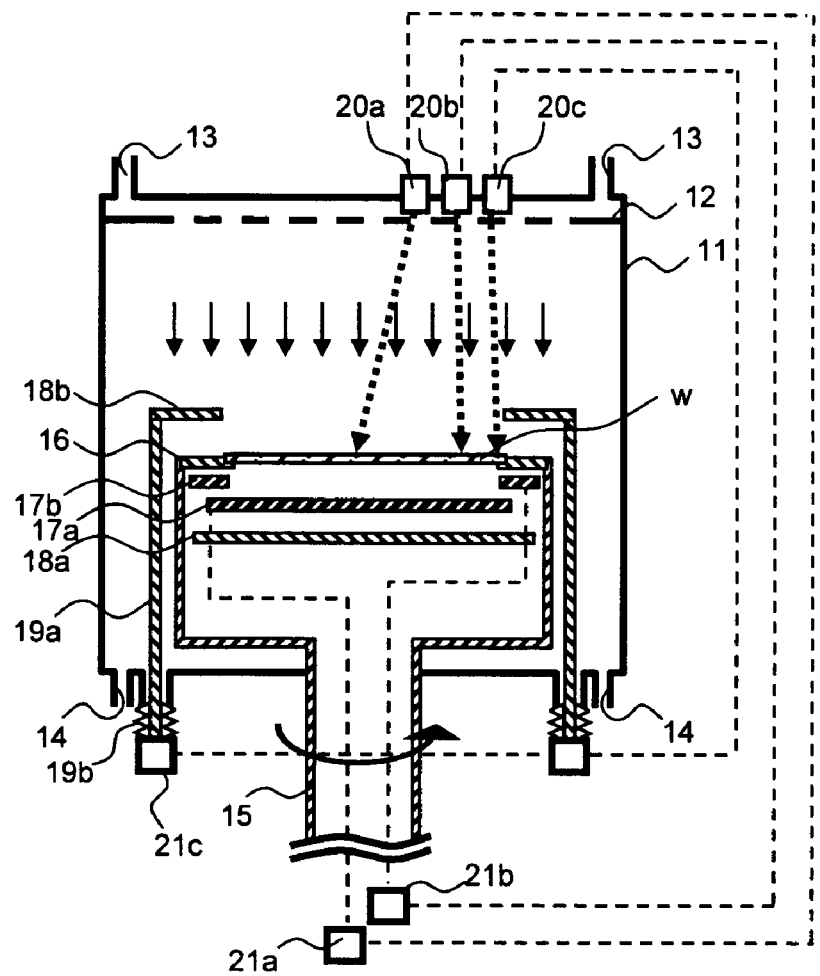
FIG. 1 is a sectional view of a manufacturing apparatus for a semiconductor device according to an embodiment of the invention.

Reference will now be made in detail to the present embodiment of the invention, an example of which is illustrated in the accompanying drawing. Wherever possible, the same reference numbers will be used throughout the drawing to refer to the same or like parts.

Embodiments of the invention will be described below with reference to drawings.

FIG. 1 shows a sectional view of a manufacturing apparatus for a semiconductor device according to the present embodiment. As shown in FIG. 1, in a reaction chamber 11 in which film formation processing of a wafer w is performed, gas supply ports 13 for supplying a gas onto the wafer w via a straightening plate 12 and gas exhaust ports 14 for exhausting the gas from below the reaction chamber 11 are arranged. The gas to be used includes a process gas containing a film forming gas and carrier gas and a cooling gas for cooling wafers. Inside the reaction chamber 11, a rotation driving unit 15 for rotating the wafer w and an annular holder 16 for holding the wafer in its outer circumferential part on the rotation driving unit 15 are arranged. An in-heater 17a for heating the wafer w is arranged below the holder 16 and an out-heater 17b for heating an edge part of the wafer w is arranged between the holder 16 and in-heater 17a. A disk-shaped reflector 18a is arranged below the in-heater 17a and an annular reflector 18b is arranged above the holder 16. These reflectors 18a and 18b are each formed, for example, from SiC base material. The reflector 18b is held by a driving shaft 19a, for example, at three points.

Above the reaction chamber 11, temperature measuring mechanisms 20a, 20b, and 20c such as radiation thermometers are arranged, and the temperature in the center of the wafer w, that of an edge near area of the wafer w, and that of an outermost circumference of the wafer w (an area on the holder 16) are measured respectively. The temperature measuring mechanism 20a is connected to a control mechanism 21a for controlling the temperature of the heater 17a based on the measured temperature. The temperature measuring mechanism 20b is connected to a control mechanism 21b for controlling the temperature of the heater 17b based on the measured temperature. The temperature measuring mechanism 20c is connected to a control mechanism 21c for controlling a position of the reflector 18b by vertically driving the driving shaft 19a based on the measured temperature. The control mechanism 21c is connected to the driving shaft 19a via a bellows pipe 19b and a driving mechanism 19 is constructed by these.

Using a manufacturing apparatus for a semiconductor device described above, for example, a Si epitaxial film is formed on the wafer w. First, for example, a 12-inch wafer w is introduced into the reaction chamber 11 and mounted on the holder 16. Then, for example, a process gas which contains 20 to 100 SLM of carrier gas: $H_2$, 50 sccm to 2 SLM of source gas: $SiHCl_3$, and very small quantities of dopant gases: $B_2H_6$ and $PH_3$ is introduced and supplied onto the wafer w. The pressure inside the reaction chamber 11 is controlled, for example, to 1333 Pa (10 Torr) to atmospheric pressure. Then, excessive process gas is exhausted through the gas exhaust ports 14.

Figure 2:
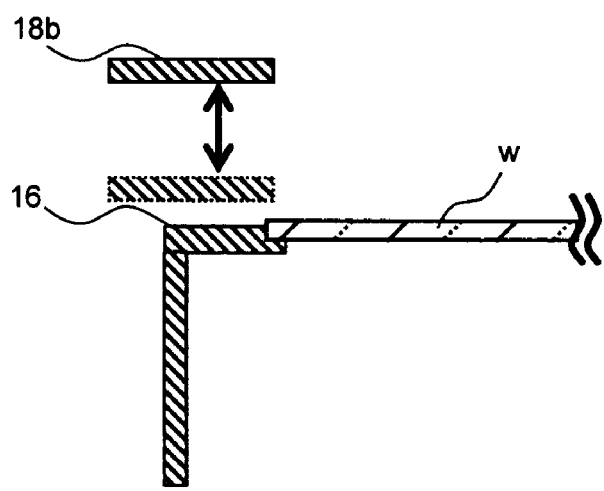
FIG. 2 is a partially enlarged sectional view showing a driving state of a reflector according to an embodiment of the invention.

Then, the temperatures of the in-heater 17a and out-heater 17b (for example, the heater temperature: 1400 to 1500° C.) are controlled by the control mechanisms 21a and 21b respectively so that each temperature of the wafer w measured by the temperature measuring mechanisms 20a, 20b, and 20c will be 1100° C. In addition, as shown in FIG. 2, the temperature of the holder 16 is controlled (for example, the holder temperature: 1150 to 1180° C.) with the position of the reflector 18b being vertically controlled, for example, in a range of 1 mm to 50 mm from the upper surface of the holder 16. With the position of the reflector 18b being drive-controlled vertically, the temperature of the holder 16 can be varied between ±10° C. or so. By controlling the temperatures of the in-heater 17a and out-heater 17b and the position of the reflector 18b as described above, the wafer w is heated to have a uniform film formation temperature.

Accordingly, with the in-plane temperature of the wafer w being controlled to be uniform, a uniform epitaxial film whose variations in film thickness is 0.5% or less is formed on the wafer w and also an occurrence of slippage is suppressed.

Since slippage occurs not only when forming a film on a wafer, but also when cooling a wafer, uniformity of the in-plane temperature of the wafer w is also needed when a cooling gas is supplied. Therefore, like when forming a film, an occurrence of slippage is suppressed also when cooling a film by the in-plane temperature of the wafer w being controlled to be uniform.

Then, when a semiconductor device is formed by undergoing an element formation process and element separation process, it becomes possible to have an improved yield and to stabilize element characteristics. Particularly by applying to an epitaxial film formation process of a power semiconductor device such as power MOSFETs and IGBT (insulated-gate bipolar transistors) requiring thick film growth of several tens to 100 µm in an N-type base area, P-type base area, dielectric isolation area and the like, excellent element characteristics can be obtained.

Incidentally, SiC base material is used as material of the reflectors 18a and 18b in the present embodiment, but any heat-resistant material that can reflect heat and has high thermal conductivity without metallic contamination may be used, including an insulator. For example, material obtained by coating such as an SiC sintered body, AlN sintered body, SiN sintered body, and carbon base material such as graphite with an AlN film, SiC film, or iridium film can be used.

Then, the reflectors 18a and 18b are not particularly limited and may be a plate-like or mesh shape as long as they can control the temperature of the holder 16. The upper surface of the reflector 18b preferably has an annular (doughnut) shape. Further, the reflector 18b is held by the driving shaft 19a at three points, but it is sufficient that the reflector 18b is held with stability. The reflector 18b may be held at four points or more, but the number of points must be to such an extent that the flow of gas is not interfered.

It is preferable that an area measured by the temperature measuring mechanism 20a is, for example, a central area of the wafer w excluding an edge part where the temperature is dominated by the in-heater 17a and an area measured by the temperature measuring mechanism 20b is an area of 5 to 20 mm from an outer circumference of the wafer w where the temperature is dominated by the in-heater 17b. It is also preferable that an area measured by the temperature measuring mechanism 20c is an outermost circumference, that is, an area on an outer circumference side from the area measured by the temperature measuring mechanism 20b, 10 mm (±10%) from the edge of the wafer w, and an area on the holder 16 at a position of 2 to 3 mm from the edge of the holder 16.

Figure 3:
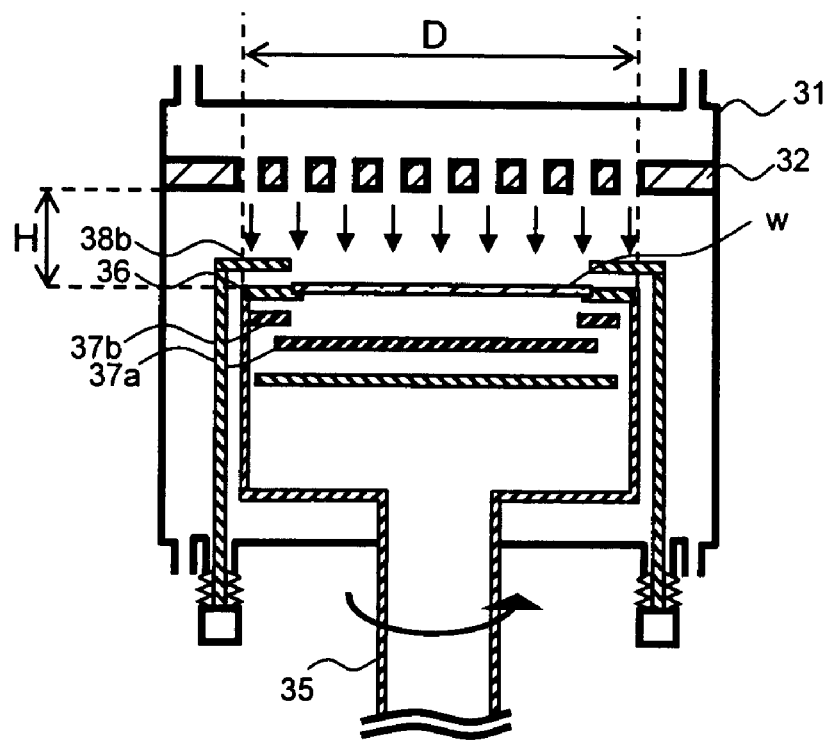
FIG. 3 is a sectional view of a manufacturing apparatus for a semiconductor device according to an embodiment of the invention.

A manufacturing apparatus for a semiconductor device having a sectional view shown in FIG. 1 is used in the embodiment described above, but the invention is not limited to such a manufacturing apparatus for a semiconductor device. For example, the distance between the straightening plate arranged above the wafer w and the holder is 20 to 100 mm in FIG. 1, but as shown in FIG. 3, the clearance between a straightening plate 32 and a holder 36 in a reaction chamber 31 may be reduced to 20 mm or so to bring the straightening plate 32 closer to the wafer w.

By bringing the straightening plate 32 closer to the wafer w, as described above, a uniform flow of gas from the straightening plate 32 onto the wafer w can be realized. Accordingly, it becomes possible not only to form a uniform film on the wafer w, but also to cool the wafer w in a short time while maintaining a uniform temperature distribution when a cooling gas is flown. Therefore, it becomes possible to suppress an occurrence of slippage like when forming a film on a wafer and also to reduce costs by shortening a lead time.

Also, if the clearance between the straightening plate 32 and the holder 36 is made shorter in an apparatus by raising the holder 36 and heaters 37a and 37b, the distance between a rotation driving means 35 and the heaters 37a and 37b becomes longer and therefore, the temperature rise of the rotation driving means 35 can be suppressed.

If the clearance between the straightening plate 32 and the holder 36 is H and the diameter of the holder 36 is D, it is preferable that $$H/D \leq 1/5$$

is satisfied. If H/D exceeds 1/5, it will be difficult for a supplied gas to reach the wafer w in a straightened state.

Incidentally, if the distance between the wafer w and the straightening plate 32 is made shorter, a reflector 38b will accordingly be controlled below a position of the straightening plate 32.

Figure 4:
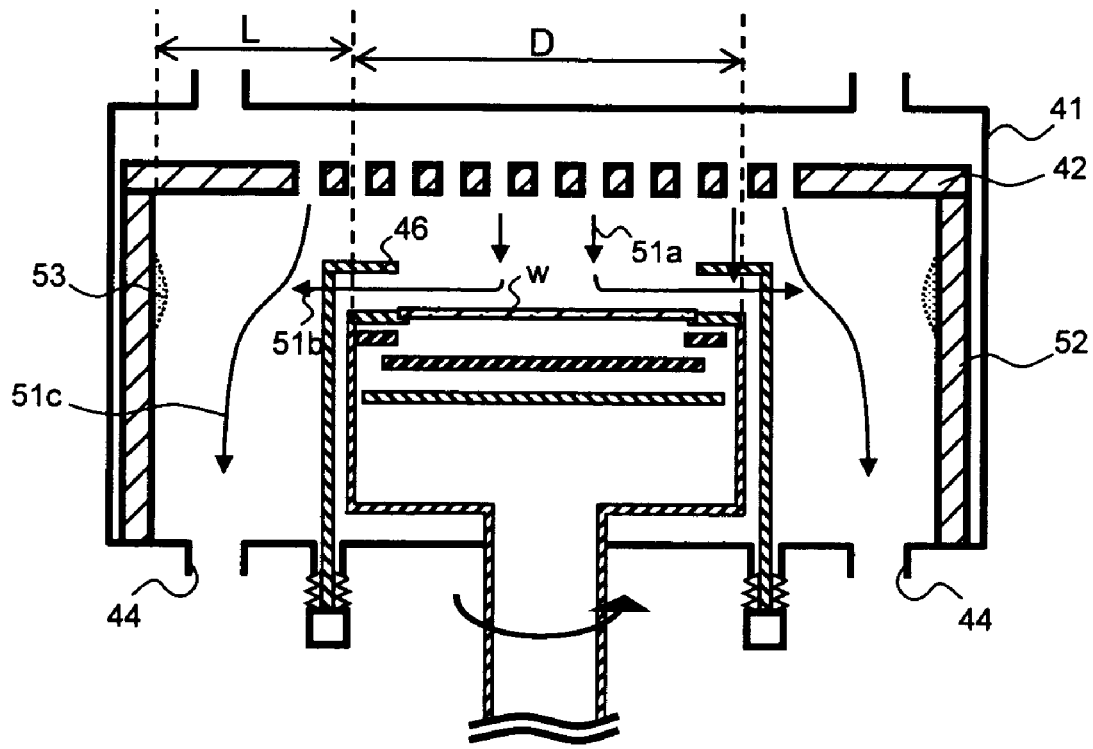
FIG. 4 is a sectional view of a manufacturing apparatus for a semiconductor device according to an embodiment of the invention.

Also, as shown in FIG. 4, the diameter of a reaction chamber 41 may be increased and the clearance between a sidewall of the reaction chamber 41 and an edge of a holder 46 holding the wafer w prolonged. After reaching the wafer w, a gas 51a supplied onto the wafer w from above via a straightening plate 42 flows in a sidewall direction of the reaction chamber 41 along the upper surface of the wafer w. Then, a flow of gas 51b including a process gas and reaction products whose temperature is raised by passing over the wafer w are reaching the sidewall of a liner 52 connected to the straightening plate 42, provided inside the side of the reaction chamber 41. Then, a deposit 53 is generated while the flow of gas 51b is cooled by the sidewall.

Therefore, by increasing the clearance between a sidewall of the reaction chamber 41 and an edge of a holder 46, the deposit 53 is prevented from being generated or dispersed. This is because convection is suppressed by a flow of gas 51c supplied to the outer circumference of the holder 46 from above via the straightening plate 42, making it easier to be drifted toward the direction of a gas exhaust port 44. By suppressing generation of the deposit 53 on the sidewall in this way, it becomes possible to suppress metallic contamination of the wafer w and also to improve the yield of formed semiconductor elements.

If the diameter of the holder 46 is D and the clearance between the edge of the holder 46 and the sidewall of the liner 52 (the reaction chamber 41 when no liner is provided) is L, it is preferable to set $$2/15 \leq L/D \leq 7/15$$

If L/D is less than 2/15, generation of deposits cannot be sufficiently suppressed. If L/D exceeds 7/15, the degree of increase in its effect decreases, or rather a problem accompanying a larger apparatus due to an increase in the clearance L will come to the fore. Preferably, this relational expression is $1/5 \leq L/D \leq 2/5$.

Compared with FIG. 1, the clearance between the straightening plate and holder is made shorter and then the clearance between the sidewall and holder edge is made longer in FIG. 4, but even with only one of them, an effect thereof can still be obtained. However, the flow rate of gas is increased and a deposit is made easier to be generated by shortening the clearance between the straightening plate and holder and therefore, it is preferable to fulfill both conditions.

In these manufacturing apparatuses for a semiconductor device, the wafer w is carried in and carried out through an opening (not shown) provided on the side of the reaction chamber by a handling arm (not shown).

In the above embodiments, formation of a Si single crystal layer (epitaxial growth layer) has been described, but the present embodiment can also be applied when a poly-Si layer is formed. Also, the present embodiment can be applied to other compound semiconductors such as a GaAs layer, a GaAlAs layer, and an InGaAs layer. Furthermore, the present embodiment can be applied to formation of a $SiO_2$ film or $Si_3N_4$ film. For a $SiO_2$ film, in addition to mono-silane ($SiH_4$), an $N_2$, $O_2$, or Ar gas will be supplied and, for a $Si_3N_4$ film, in addition to mono-silane ($SiH_4$), an $NH_3$, $N_2$, $O_2$, or Ar gas will be supplied.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for manufacturing a semiconductor device, the manufacturing apparatus comprising:
   a reaction chamber configured to introduce a wafer;
   a gas supply unit configured to supply a gas to the reaction chamber;
   a gas exhaust configured to exhaust the gas from the reaction chamber;
   a holder configured to hold the wafer at an outer circumferential part of the wafer;
   a first heater configured to heat the wafer from below;
   an annular reflector configured to reflect heat from the holder, the annual reflector being provided above a top of the holder and the annular reflector having a through-hole for passage of the supplied gas to the wafer; and
   a drive mechanism configured to drive the annular reflector to control the temperature of the outer circumferential part of the wafer at least during forming a film on the wafer.

2. The apparatus according to claim 1, further comprising:
   a first temperature measuring mechanism configured to detect a temperature of an outermost circumference of the wafer, and
   a first control mechanism configured to control the drive mechanism based on the detected temperature of the outermost circumference.

3. The apparatus according to claim 1, further comprising:
   a second temperature measuring mechanism configured to detect a temperature of a center of the wafer; and
   a second control mechanism configured to control the first heater based on the detected temperature of the center.

4. The apparatus according to claim 1, further comprising:
   a second heater configured to heat an edge part of the wafer;
   a third temperature measuring mechanism configured to detect a temperature of the edge part of the wafer; and
   a third control mechanism configured to control the second heater based on the detected temperature of the edge part.

5. The apparatus according to claim 1, further comprising a straightening plate above the wafer.

6. The apparatus according to claim 5, wherein the straightening plate is arranged to supply the gas onto the wafer in a straightened state.

7. The apparatus according to claim 5, wherein if a clearance between the straightening plate and the holder is H and a diameter of the holder is D, $H/D \leq 1/5$ is satisfied.

8. The apparatus according to claim 1, wherein if a diameter of the holder is D and a distance between an edge of the holder and a sidewall of the reaction chamber is L, $2/15 \leq L/D \leq 7/15$ is satisfied.

9. The apparatus according to claim 1, wherein the annular reflector is drive-controlled vertically in a range of 1 mm to 50 mm from an upper surface of the holder.

10. The apparatus according to claim 1, wherein the annular reflector has at least one of SiC base material, carbon base material, AlN base material, and SiN base material as a base material.

11. The apparatus according to claim 1, wherein the gas includes at least one of a process gas and a cooling gas.

* * * * *